United States Patent [19]

Hara

[11] Patent Number: 5,544,099
[45] Date of Patent: Aug. 6, 1996

[54] METHOD OF WRITING DATA INTO ELECTRICALLY ERASABLE AND PROGRAMMABLE READ ONLY MEMORY CELL WITHOUT DISTURBANCE TO OTHER CELLS

[75] Inventor: Hideki Hara, Tokyo, Japan

[73] Assignee: NEC Corporation, Tokyo, Japan

[21] Appl. No.: 543,818

[22] Filed: Oct. 16, 1995

[30] Foreign Application Priority Data

Oct. 20, 1994 [JP] Japan ................................. 6-255034

[51] Int. Cl.⁶ .................................................. G11C 16/04
[52] U.S. Cl. ............................. 365/185.19; 365/185.02; 365/185.06; 365/185.22
[58] Field of Search ........................ 365/185.19, 185.02, 365/185.06, 185.22

[56] References Cited

U.S. PATENT DOCUMENTS

| | | | |
|---|---|---|---|
| 4,200,841 | 4/1980 | Nagata et al. | 365/185.19 |
| 4,434,478 | 2/1984 | Cook et al. | 365/185.19 |
| 4,460,982 | 7/1984 | Gee et al. | 365/185.19 |
| 4,520,461 | 5/1985 | Simko | 365/185.19 |
| 4,611,309 | 9/1986 | Chuang et al. | 365/185.19 |
| 4,617,652 | 10/1986 | Simko | 365/185.19 |
| 4,860,258 | 8/1989 | Fruhauf et al. | 365/185.19 |
| 4,966,571 | 2/1991 | Kume et al. | 365/185.19 |
| 5,068,827 | 11/1991 | Yamada et al. | 365/185.19 |
| 5,257,225 | 10/1993 | Lee | 365/185.19 |
| 5,258,949 | 11/1993 | Chang et al. | 365/185.19 |
| 5,487,033 | 1/1996 | Keeney et al. | 365/185.19 |

OTHER PUBLICATIONS

"Golden age of Flash-Type Leading Part of Floppy Substitute"; Nikkei Micro–devices, Mar. 1990, pp. 72–76.

N. Kodama et al.; "A 5V only 16 Mbit Flash EEPROM Cell Using Highly Reliable Write/Erase Technologies"; NEC Corporation, pp. 75–76.

Primary Examiner—Joseph E. Clawson, Jr.
Attorney, Agent, or Firm—Whitham, Curtis, Whitham & McGinn

[57] ABSTRACT

A floating gate type field effect transistor increases the threshold during an application of a write-in pulse to the control gate electrode thereof so as to inject hot electrons into the floating gate electrode, and the write-in pulse is decayed along a waveform having a gradient smaller than a gradient of a pulse signal assumed to take place in a source/drain region of a non-selected floating gate type field effect transistor sharing the selected word line with the selected floating gate type field effect transistor, thereby preventing the non-selected floating gate type field effect transistor from the gate disturb phenomenon.

3 Claims, 9 Drawing Sheets

METHOD OF WRITING DATA INTO ELECTRICALLY ERASABLE AND PROGRAMMABLE READ ONLY MEMORY CELL WITHOUT DISTURBANCE TO OTHER CELLS

FIELD OF THE INVENTION

This invention relates to a flash electrically erasable and programmable read only memory device and, more particularly, to a method of writing a data bit into a flash electrically erasable and programmable read only memory cell.

DESCRIPTION OF THE RELATED ART

Various flash memory, i, e, the electrically erasable and programmable read only memory devices concurrently erasable type are introduced in Nikkei Microdevices, March 1990, pages 72 to 76, and the reporter discusses advantages and disadvantages. The stacked electrically erasable and programmable read only memory devices cell is similar to the known electrically programmable read only memory cell, and is superior to the other cell structures in view of the cell occupation area. The paper entitled as "A 5 V Only 16 Mbit Flash EEPROM Cell Using Highly Reliable Write/Erase Technologies" takes the same position as the Nikkei Microdevices, and introduces the stacked type electrically erasable and programmable read only memory cell as an attractive candidate for an ultra high-density non-volatile data storage.

The stacked electrically erasable and programmable read only memory cells are usually split into a plurality of sectors, and word lines are shared between these sectors. Hot electrons injected into the floating gate increase the threshold of the electrically erasable and programmable read only memory cell, and the accumulated electrons are evacuated from the floating gate as Fowler-Nordheim tunneling current to a source line so as to decrease the threshold. Thus, the electrically erasable and programmable read only memory cell has the low and high thresholds depending upon the electrons accumulated in the floating gate electrode, and the high and low thresholds are corresponding to the two logic levels of a data bit.

FIG. 1 illustrates a typical arrangement of electrically erasable and programmable read only memory cell array 1. A plurality of electrically erasable and programmable read only memory cells M111, M112 . . . , M121, M122, . . . and M211, M212, . . . , M221, M222, . . . form the memory cell array 1, and are split into a plurality of sectors 1a and 1b. A floating gate type field effect transistor serves as each electrically erasable and programmable read only memory cell, and FIG. 2 illustrates the structure of the floating gate type field effect transistor.

The floating gate type field effect transistor is fabricated on a p-type semiconductor substrate 2, and a heavily doped n-type drain region 2a is spaced from a heavily doped n-type source region 2b nested in a lightly doped n-type region 2c in a surface portion of the p-type semiconductor substrate 2. A first gate oxide layer 2d covers a channel region 2e between the n-type drain region 2a and the n-type source region 2b, and a floating gate electrode 2f is patterned on the first gate oxide layer 2d. The first gate oxide layer 2d is thin enough to transfer the Fowler-Nordheim tunneling current, and is less than 100 angstroms. The floating gate electrode 2f is overlaid by a second gate oxide layer 2g, and a control gate electrode 2h is provided on the second gate oxide layer 2g. The control gate electrode 2h is formed of polysilicon or from a refractory metal silicide layer laminated on a polysilicon layer. The floating gate type field effect transistors are arranged in rows and columns, and form the memory cell array 1. The floating gate type field effect transistors are hereinbelow labeled with the same references as those designating the memory cells M111 to M222.

A plurality of word lines WL1, WL2 and WLm are provided for the memory cell array 1, and are shared between the sectors 1a and 1b. In detail, columns of memory cells M111/M121, M112/M122, . . . form one of the sectors 1a, and other columns of memory cells M211/M221, M212/M222, . . . form another sector 1b. On the other hand, the rows of memory cells M111/M112, . . . M211/M212, . . . and M121/M122, . . . , M221/M222 . . . belong partially to the sector 1a and partially to another sector 1b. The rows of memory cells M111 to M222 are respectively associated with the rows of memory cells M111 to M222, and are shared between the sectors 1a and 1b, and the word lines WL1, WL2 and WLm.

A plurality of digit lines DL11/DL12/DL1n and DL21/DL22/DL2n are provided for the memory cell array 1, and are respectively associated with the columns of memory cells M111 to M222. As described hereinbefore, the columns of memory cells M111/M121, M112, M122, M211/M221, M212/M222 are split into the sectors 1a and 1b, and, accordingly, the digit lines DL11 to DL1n and DL21 to DL2n are divided for the sectors 1a and 1b.

Each of the word lines WL1 to WLm is coupled to the control gate electrodes 2h of the associated row of memory cells, and the word lines WL1 to WLm are selectively energized by a row address decoder/word line driver (not shown). On the other hand, the digit lines DL11/DL12/DL1n and DL21/DL22/DL2n are coupled to a column selector (not shown), and a column address decoder (not shown) selectively couples the digit lines DL11 to DL11n and DL21 to DL2n to a sense amplifier/write-in circuit (not shown).

Source lines S1 and S2 are respectively associated with the sectors 1a/1b, and each of the source lines S1/S2 is coupled to the source nodes 2b of the memory cells M111 to M122 or M211 to M222 of the associated sector 1a or 1b. Though not shown in FIG. 1, an erasing system is coupled to the source lines S1 and S2, and selectively applies an erasing voltage to the source lines S1 and S2 so as to concurrently evacuate the electrons accumulated in the floating gate electrodes 2f of the associated memory cells.

The prior art electrically erasable and programmable read only memory device selectively enters into a write-in mode, a read-out mode and an erasing mode.

The memory cell M111 is assumed to be changed to the write-in state. The erasing system (not shown) maintains the source line S1 to the ground voltage level, and the write-in circuit (not shown) applies 5 volts through the column selector (not shown) to the digit line DL11. The row address decoder/word line driver (not shown) lifts the potential level on the selected word line WL1 to 10 volts at time t1 (see FIG. 3). The n-type drain region 2a is reversely biased through the selected digit line DL11, and produces hot electrons. The hot electrons are attracted toward the floating gate electrode 2f due to the strong electric field created by the control gate electrode 2h, and are accumulated in the floating gate electrode 2f.

The electrons accumulated in the floating gate electrode 2f increase the threshold of the floating gate type field effect transistor M111 to around 6 volts, and such a high threshold is discriminative from a low threshold of about 3 volts representative of erased state.

When the data bits stored in the sector 1a are concurrently erased, the row address decoder/word line driver (not shown) maintains the word lines WL1 to WLm at the ground voltage, and the digit lines DL11 to DL1n are changed to floating state or the ground voltage. The erasing system applies 10 volts to the source line S1. Then, the Fowler-Nordheim tunneling phenomenon takes place across the first gate oxide layer 2d, and the electrons are evacuated from the floating gate electrodes 2f of the memory cells M111 to M122 to the source line S1. The threshold of the floating gate type field effect transistors M111 to M122 is decreased to about 3 volts. The two logic levels of a data bit are corresponding to the high threshold of 6 volts and the low threshold of 3 volts and, accordingly, to the write-in state and the erased state.

When the data bit of the memory cell M111 is accessed, the erasing system (not shown) maintains the source line S1 at the ground voltage, and the sense amplifier (not shown) supplies 1 to 3 volts through the column selector (not shown) to the digit line DL11. The row address decoder/word line driver (not shown) changes the word line WL1 to 5 volts.

If the floating gate type field effect transistor is in the erased state, the threshold is 3 volts, and current flows from the digit line DL11 through the floating gate type field effect transistor M111 to the source line S1. The sense amplifier (not shown) monitors the potential level on the selected digit line DL11, and decides the stored data bit to be the logic level corresponding to the low threshold.

On the other hand, if the floating gate type field effect transistor is in the write-in state, the threshold is 6 volts, and the floating gate type field effect transistor M111 is turned off. For this reason, current does not flow through the memory cell M111, and the potential drop does not take place. The sense amplifier (not shown) decides the data bit to be the other logic level corresponding to the high threshold.

The prior art electrically erasable and programmable read only memory cell encounters a problem in that the selected word line disturbs non-selected memory cells coupled to the selected word line.

In detail, a non-selected memory cell shares the source line S1/S2 with other non-selected memory cells of the same sector 1a/1b, and the word line associated with the selected memory cell is shared with the non-selected memory cells in the same row. If data bits are repeatedly written into and erased from one of the memory cells such as M111, the non-selected memory cells such as M211/M212 are affected by the selected word line WL1, and the first gate oxide layers 2d are subjected to stress due to the write-in voltage on the selected word line WL1. As a result, electrons are undesirably injected through the first gate oxide layers 2d into the floating gate electrodes 2f, and the injected electrons unintentionally change the thresholds of the non-selected floating gate type field effect transistors M211 and M212. This phenomenon is called "gate disturb".

The gate disturb is derived from the Fowler-Nordheim tunneling due to a strong electric field, unexpected undershoot 3 in the n-type source/drain regions 2a and 2b at the trailing edge of the write-in pulse on the selected word line WL1 (see FIG. 3) and so on. The potential level on the selected word line WL1 affects the n-type source/drain regions 2a/2b of the non-selected memory cells M211/M212 through the first gate oxide layers 2d, and the trailing edge of the write-in pulse pushes down the potential levels in the n-type source/drain regions 2a/2b due to the parasitic capacitances coupled thereto. When the n-type source/drain regions 2a and 2b are changed to a negative potential level, the p-n junctions between the substrate 2 and the source/drain regions 2a/2b are forwardly biased, and forward current flows from the p-type semiconductor substrate 2 into the n-type source/drain regions 2a/2b. Then, hot electrons are produced. If the floating gate electrodes 2f have been positively charged, the hot electrons are attracted to the floating gate electrodes 2f, and are accumulated in the floating gate electrodes 2f. This results in the unintentional fluctuation of the threshold. The hot electrons damage the first gate oxide layers 2d less than 100 angstroms thick, and deteriorate them.

Although the gate disturb becomes conspicuous around a hundred thousand repetitions, the user expects the electrically erasable and programmable read only memory cells to endure more than a million repetitions.

SUMMARY OF THE INVENTION

It is therefore an important object of the present invention to provide a method of writing data into electrically erasable and programmable read only memory cells without the gate disturb.

To accomplish the object, the present invention proposes to gently decay a write-in signal.

In accordance with the present invention, there is provided a method of writing data into a memory cell, comprising the steps of: a) preparing a semiconductor nonvolatile memory device including a plurality of floating gate type field effect transistors serving as addressable memory cells and grouped into a plurality of sectors, each of the plurality of floating gate type field effect transistors having source and drain regions spaced from each other, a floating gate electrode associated with the source and drain regions and electrically isolated from the source and drain regions and a control gate electrode associated with the source and drain regions and electrically isolated from the floating gate electrode and the source and drain regions, a plurality of word lines shared between the plurality of sectors and selectively connected to control gate electrodes of the plurality of floating gate type field effect transistors, and an addressing system having a row addressing sub-system for selectively supplying a write-in pulse signal to the plurality of word lines; b) rising the write-in pulse signal on a selected one of the plurality of word lines for writing data into at least one floating gate type field effect transistor of a selected one of the plurality of sectors; and c) decaying the write-in pulse along a waveform having a first gradient smaller than a second gradient of a waveform of a pulse signal applied to one of the source and drain regions forming a part of the floating gate type field effect transistor incorporated in a non-selected one of the sectors and coupled to the selected one of the plurality of word lines.

BRIEF DESCRIPTION OF THE DRAWINGS

The features and advantages of the method of writing data into the electrically erasable and programmable read only memory cells according to the present invention will be more clearly understood from the following description taken in conjunction with the accompanying drawings in which.

DESCRIPTION OF THE PREFERRED EMBODIMENTS

First Embodiment

Figure 4:
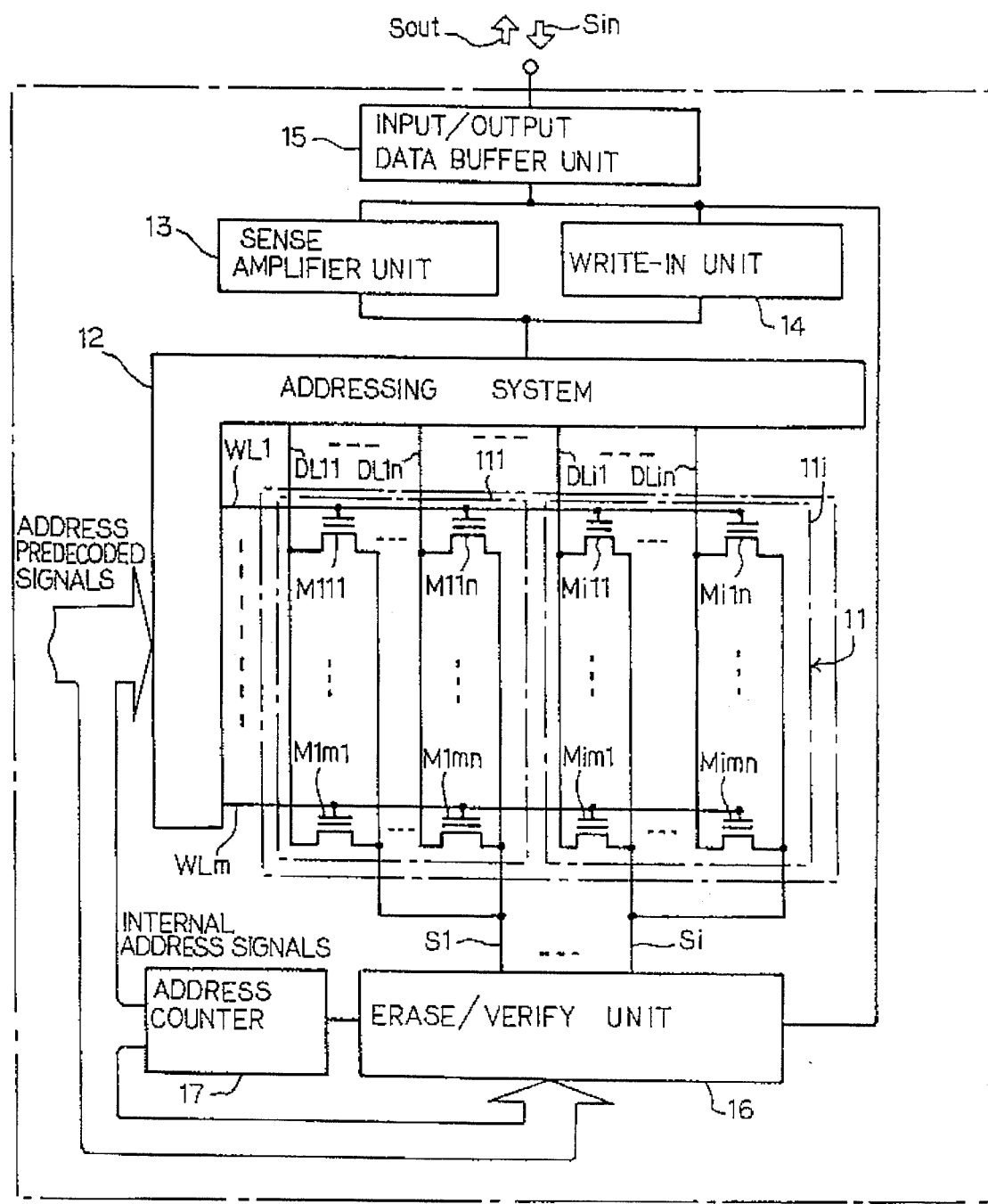
FIG. 4 is a block diagram showing the arrangement of an electrically erasable and programmable read only memory device according to the present invention.

Referring first to FIG. 4 of the drawings, an electrically erasable and programmable read only memory device is fabricated on a p-type silicon substrate 10, and changes an operation mode among a write-in mode, a read-out mode and an erasing mode.

Figure 1:
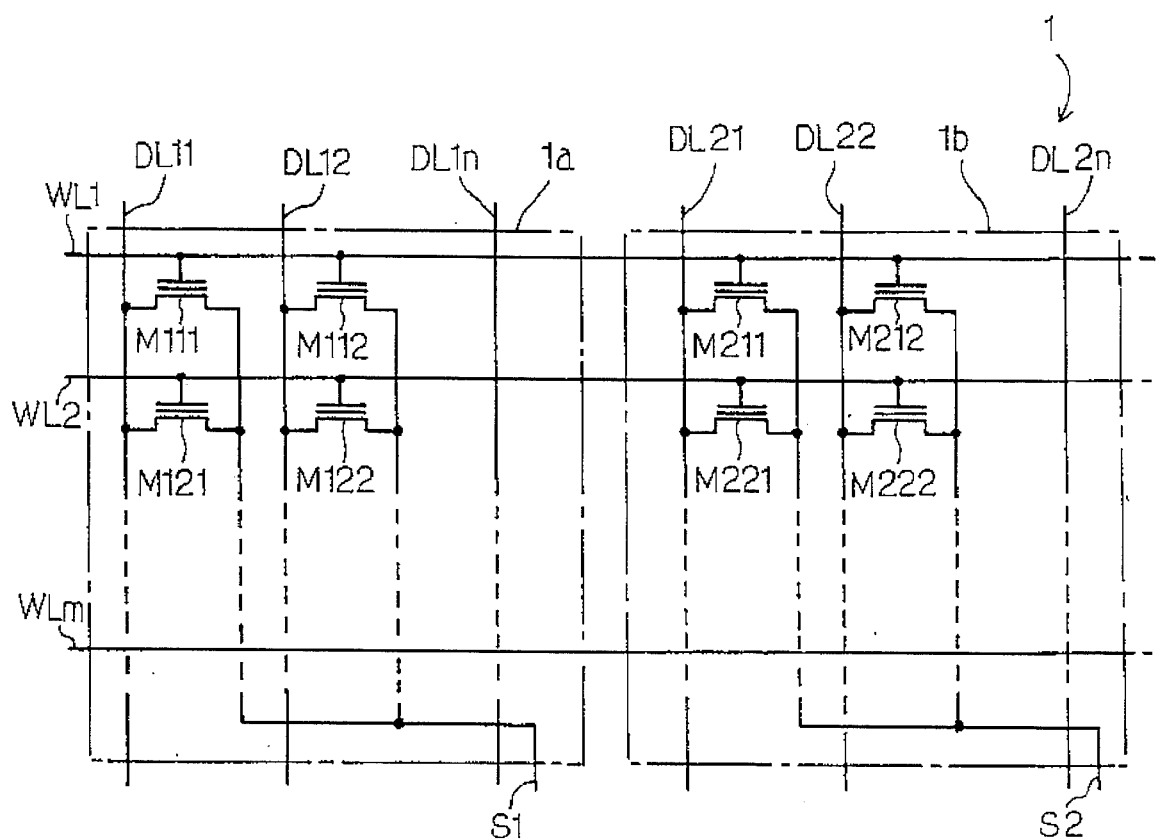
FIG. 1 is a circuit diagram showing the arrangement of the prior art electrically erasable and programmable read only memory cells.
Figure 2:
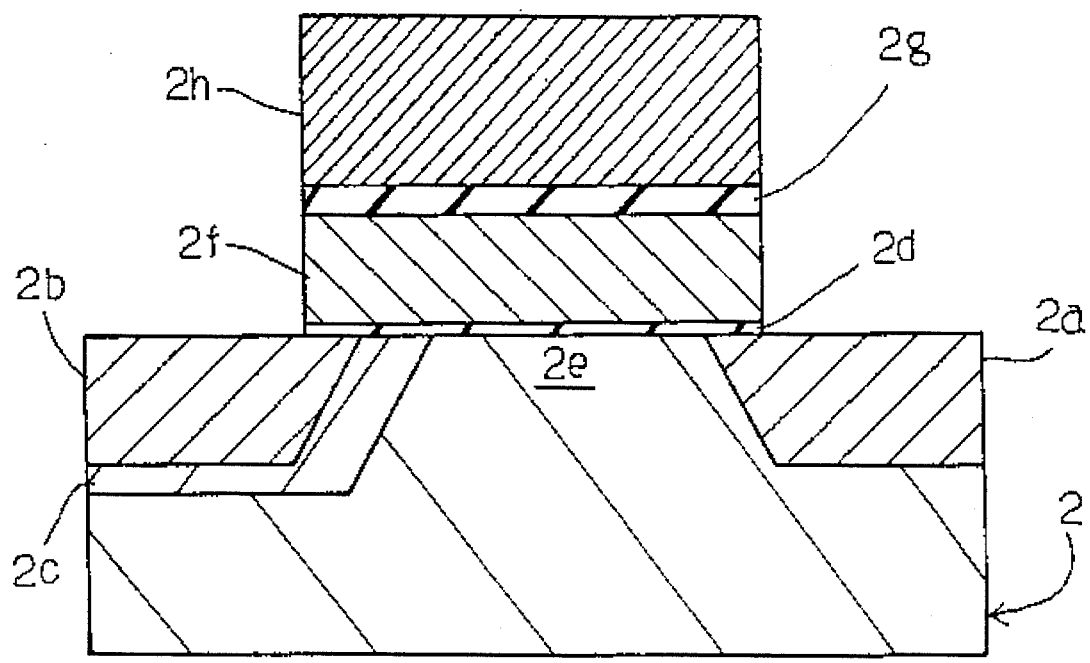
FIG. 2 is a cross sectional view showing the structure of the prior art electrically erasable and programmable read only memory cell.
Figure 3:
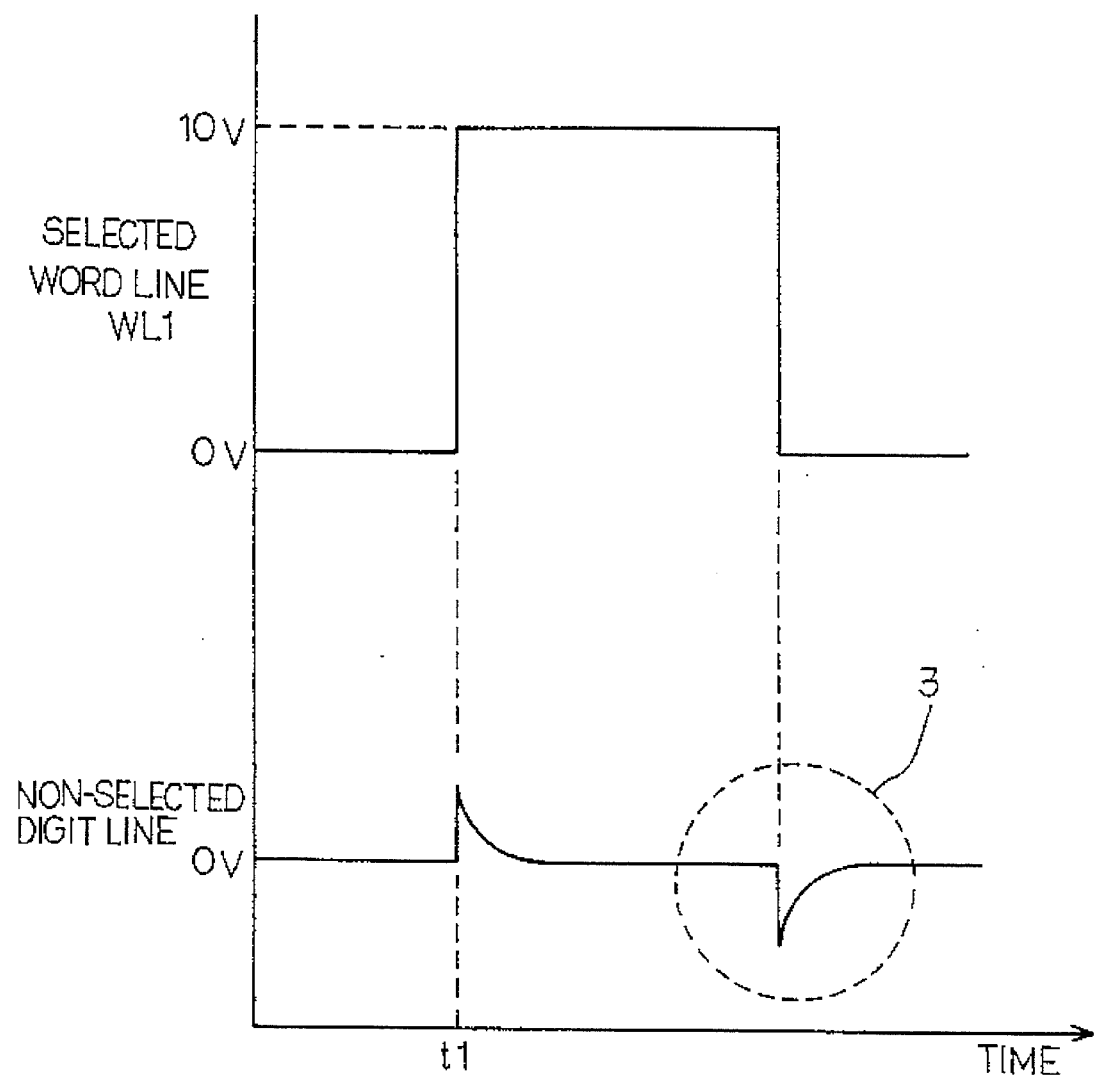
FIG. 3 is a timing chart showing the write-in pulse applied to the selected word line and the undesirable under-shoot in the source/drain regions of the non-selected memory cells.

The electrically erasable and programmable read only memory device comprises a memory cell array 11, and a plurality of memory cells M111–M11n to M1m1–M1mn, . . . and Mi11–Mi1n to Mim1–Mimn form in combination the memory cell array 11. The plurality of memory cells M111 to Mimn are arranged in rows and columns, and the columns of memory cells M111 to Mimn are divided into a plurality of sectors 111 to 11i. The n-channel floating gate type field effect transistors respectively serve as the plurality of memory cells M111 to Mimn, and are designated by the same references as the memory cells M111 to Mimn in the following description. The structure of the n-channel floating gate type field effect transistors M111 to Mimn is similar to that of the prior art electrically erasable and programmable read only memory cells shown in FIG. 2, and no further description is incorporated hereinbelow for the sake of simplicity.

The memory cells M111 to Mimn maintain data bits without power supply, and the electrically erasable and programmable read only memory device is a non-volatile memory device.

Sector addresses are respectively assigned to the sectors 111 to 11i, and the rows of memory cells M111–Mi11 to M1m1–Mimn are respectively assigned row addresses. Column addresses are assigned to the columns of memory cells M111–M1m1 to M11n–M1mn/Mi11–Mim1 to Mi1n–Mimn of each sector. Thus, each of the memory cells M111 to Mimn is specified by using the sector address, the row address and the column address.

A plurality of word lines WL1 to WLm are provided for the memory cell array 11, and are respectively associated with the rows of memory cells M111–Mi11 to M1m1–Mimn. Each of the word lines WL1 to WLm is coupled to the control gate electrodes of the associated n-channel floating gate type field effect transistors M111–Mi1n, . . . or M1m1–Mimn, and is shared among the sectors 111 to 11i.

A plurality of digit lines DL11–DL1n, . . . and DLi1–DLin are further provided for the memory cell array 11, and are respectively associated with the columns of memory cells M111–M1m1, . . . , M11n–M1mn, . . . , Mi11–Mim1 and Mi1n–Mimn. Each of the digit lines DL11 to DLin is coupled to the drain regions of the associated n-channel floating gate type field effect transistors M111–M1m, . . . , M11n–M1mn, Mi11–Mim1, . . . or Mi1n–Mimn.

A plurality of source lines S1 to Si are respectively associated with the sectors 111 to 11i, and each of the source lines S1 to Si is coupled to the source regions of the n-channel floating gate type field effect transistors M111–M1mn, . . . or Mi11–Mimn of the associated sector.

The electrically erasable and programmable read only memory device according to the present invention further comprises an addressing system 12, a sense amplifier unit 13, a write-in unit 14 and an input/output data buffer unit 15.

Address predecoded signals are supplied to the addressing system 12 in the write-in mode and the read-out mode, and internal address signals are supplied to the addressing system 12 in the erasing mode. The addressing system 12 selects one of the word lines WL1 to WLm, and selectively couples the digit lines DL11 to DLin to the sense amplifier unit 13 or the write-in unit 14. The addressing system 12 puts the digit lines DL11 to DLin into a floating state or alternatively grounds them in the erasing mode. The addressing system 12 will be hereinlater described in detail.

The sense amplifier unit 13 is enabled in the read-out mode, and decides whether the accessed memory cell is in write-in state or erased state depending upon the potential level on the selected digit line. Namely, the sense amplifier unit 13 applies a read-out drain voltage of about 1–3 volts through the addressing system 12 to the selected digit line, and monitors the potential level on the selected digit line. If the selected memory cell is in the erased state, current flows from the associated digit line through the selected memory cell to the source line, and potential drop takes place. On the other hand, if the selected memory cell is in the write-in state, no current flows through the selected memory cell, and the selected memory cell keeps the potential level on the associated digit line. The sense amplifier unit 13 informs the input/output data buffer unit 15 of the state of the accessed memory cell, and the input/output data buffer unit 15 generates an output data signal Sour indicative of the detected state.

On the other hand, the write-in unit 14 is enabled in the write-in mode. An input data signal Sin is transferred through the input/output data buffer unit 15 to the write-in unit 14, and the write-in unit 14 supplies a write-in drain voltage of about 5 volts through the addressing system 12 in case where the input data signal Sin is indicative of the write-in state.

The electrically erasable and programmable read only memory device according to the present invention further comprises an erase/verify unit 16 and an address counter 17.

The erase/verify unit 16 maintains the source lines S1 to Si at the ground voltage level in the write-in mode and the read-out mode, and selectively applies an erasing pulse signal to the source lines S1 to Si.

The erase/ verify unit 16 checks the memory cells of the selected sector to see whether or not all of the memory cells are changed to the erased state through a sequential read-out operation on the memory cells. The erase/verify unit 16 repeats the application of the erasing pulse signal and the sequential read-out until all of the memory cells of the selected sector enter into the erased state. The repetition of erase and verify is desirable, because the memory cells are prevented from being in an excessively erased state or the depletion mode of the n-channel floating gate type field effect transistors.

The electrically erasable and programmable read only memory device according to the present invention further comprises a timing controller for the write-in sequence, the read-out sequence and the erasing sequence. However, the timing generator is not described in the specification, because it is similar to that of the prior art.

The addressing system 12 includes a row addressing sub-system 12a responsive to the address predecoded signal or the internal address signals indicative of a row address for selectively energizing the word lines WL1 to WLm.

The row addressing sub-system 12a includes a row address decoder circuit 12b, and a plurality of NAND gates ND1 to NDm form in combination the row address decoder circuit 12b. The address predecoded signals indicative of the row address or the internal address signals also indicative of the row address are selectively supplied to the NAND gates ND1 to NDm, and one of the NAND gates ND1 to NDm changes the row address decoded signal thereof from the positive power voltage Vcc to the ground voltage.

Figure 6:
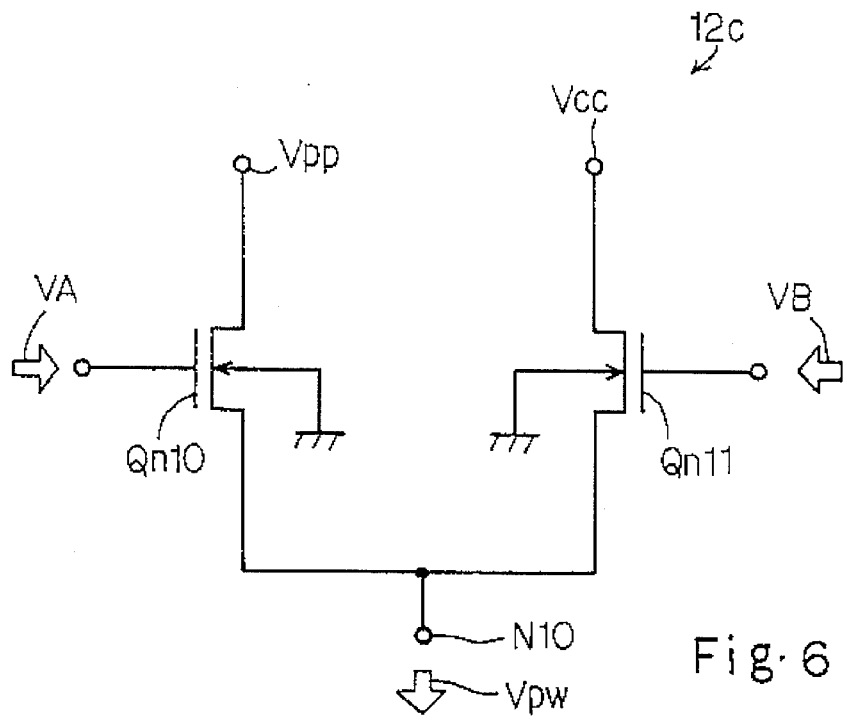
FIG. 6 is a circuit diagram showing a variable voltage source incorporated in the row addressing sub-system.

The row address sub-system 12a further includes a variable voltage source 12c (see FIG. 6), and the variable voltage source 12c is implemented by a parallel combination of two n-channel enhancement type switching transistors Qn10 and Qn11. The n-channel enhancement type switching transistor Qn10 is coupled between a source of boosted voltage Vpp and an output node N10, and the other n-channel enhancement type switching transistor Qn11 is coupled between the source of power voltage Vcc and the output node N10. In this instance, the boosted voltage Vpp is about 10 volts, and the positive power voltage Vcc is about 5 volts. An internal control signal VA is supplied from the timing generator (not shown) to the gate electrode of the n-channel enhancement type switching transistor Qn10, and the other n-channel enhancement type switching transistor Qn11 is gated with another internal control signal VB. The internal control signal VB is the complementary signal of the internal control signal VA, and changes the voltage level between 14 volts and the ground voltage. As a result, the variable voltage source 12c changes the output voltage Vpw between 5 volts and 14 volts depending upon the internal control signals VA and VB.

The potential decay of the variable voltage Vpw is dependent on the channel conductance of the n-channel enhancement type switching transistor Qn11, and the dimensions of the n-channel enhancement type switching transistor Qn11 change time period T1 (see FIG. 7) and, accordingly, the gradient of the potential decay. Time period T2 is determined by the time constant of the discharge current path from the selected word line WL1/WLm through the associated inverter INV1/INVm to the ground voltage line GND.

Figure 5:
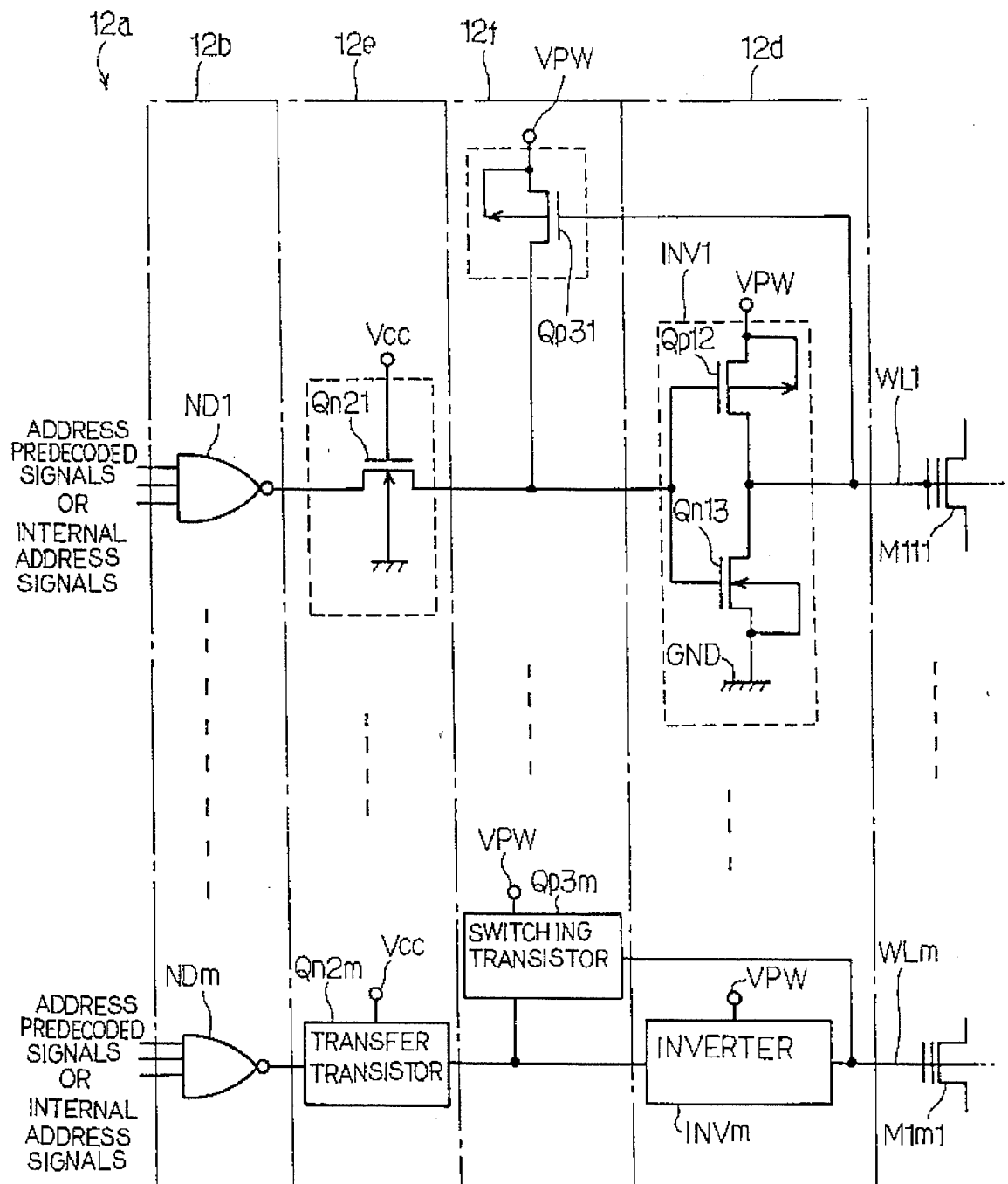
FIG. 5 is a circuit diagram showing the arrangement of a row addressing sub-system incorporated in the electrically erasable and programmable read only memory device.

Turning to FIG. 5, the row address sub-system 12a further includes a word line driver circuit 12d, and the word line driver circuit 12d is implemented by an array of inverters INV1 to INVm. The inverters INV1 to INVm are coupled between a variable voltage line VPW and the ground voltage line GND, and the variable voltage line VPW propagates the variable voltage Vpw to the inverters INV1 to INVm.

A p-channel enhancement type switching transistor Qp12 and an n-channel enhancement type switching transistor Qn13 form in combination each of the inverters INV1 to INVm, and each of the row address decoded signals is supplied from the NAND gate ND1/NDm to the gate electrode of the p-channel enhancement type switching transistor Qp12 and the gate electrode of the n-channel enhancement type switching transistor Qn13 of the associated inverter INV1/INVm. The gate electrodes of the switching transistors Qp12 and Qn13 serve as an input node of the inverter INV21/INV2m.

The row addressing sub-system 12a further includes a protection circuit 12e coupled between the row address decoder circuit 12b and the word line driver circuit 12d, and n-channel enhancement type transfer transistors Qn21 to Qn2m form the protection circuit 12e. The n-channel enhancement type transfer transistors Qn21 to Qn2m have respective source-to-drain paths coupled between the NAND gates ND1–NDm and the inverters INVl–INVm, and the gate electrodes of the n-channel enhancement type transfer transistors Qn21–Qn2m are coupled to the source of positive power voltage Vcc.

When one of the NAND gates ND1 to NDm changes the row address decoded signal to the ground voltage level, the associated n-channel enhancement type transfer transistor Qn21/Qn2m turns on, and transfers the row address decoded signal to the inverter INV1/INVm. However, if the potential level at the input node of the inverter INV1/INVm is increased through the positive power voltage Vcc to the boosted voltage Vpp, the associated n-channel enhancement type transfer transistor Qn21/Qn2m turns off, and prevents the associated NAND gate ND1/NDm from the boosted voltage Vpp.

The row addressing sub-system 12a further includes a feedback circuit 12f, and a plurality of p-channel enhancement type switching transistors Qp31 to Qp3m form in combination the feedback circuit 12f. The p-channel enhancement type switching transistors Qp31 to Qp3m have respective source-to-drain paths coupled between the variable voltage line VPW and the input nodes of the associated inverters INV1 to INVm, and the p-channel enhancement type switching transistors Qp31 to Qp3m are gated by the word lines WL1 to WLm, respectively.

Figure 7:
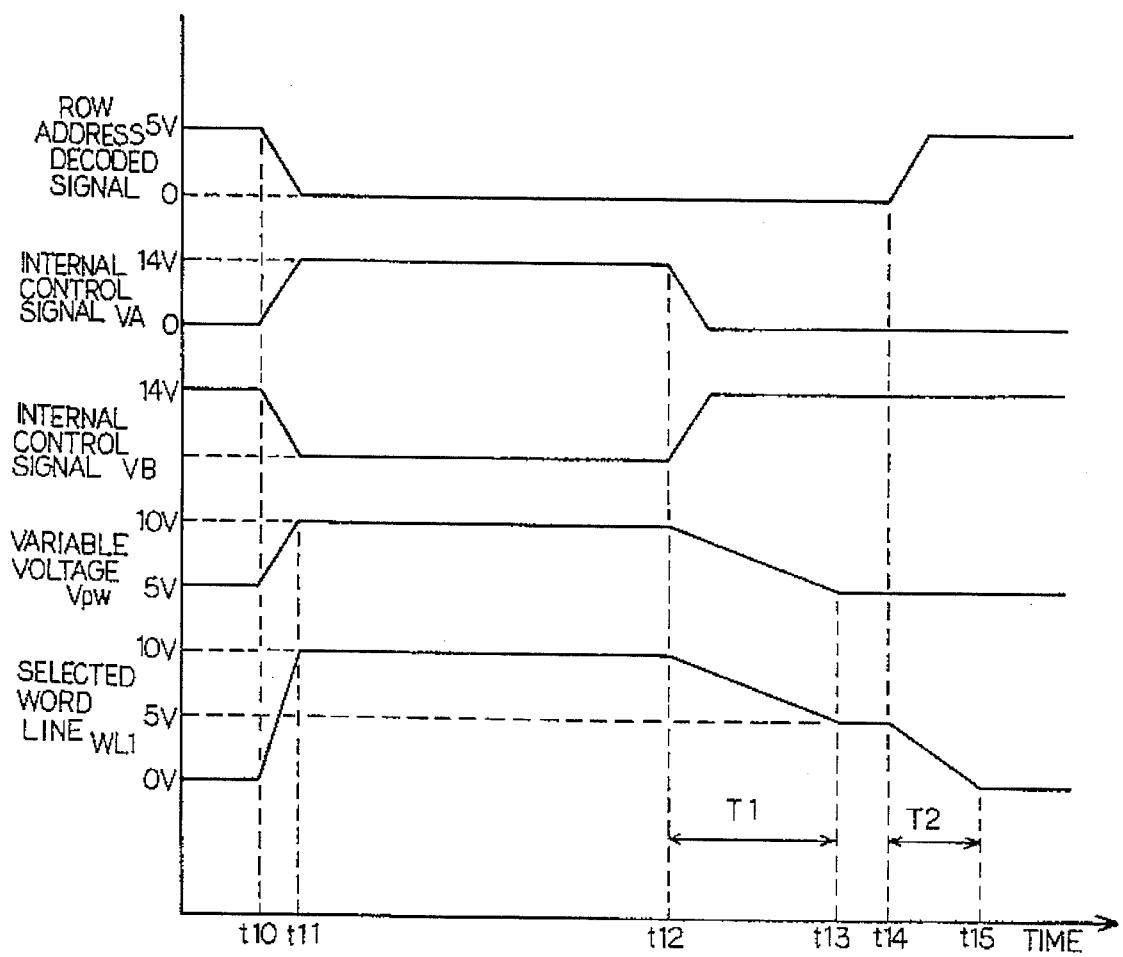
FIG. 7 is a timing chart showing the behavior of the variable voltage source.

The row addressing sub-system 12a behaves in the write-in phase as follows. FIG. 7 illustrates the sequence of related signals. Assuming now that the row address predecoded signals is indicative of the row address assigned to the word line WL1, the NAND gate ND1 starts the row address decoded signal to rise, and the internal control signal VA is changed from the ground voltage level to the boosted voltage level Vpp. The internal control signal VA causes the n-channel enhancement type switching transistor Qn10 to turn on, and the other n-channel enhancement type switching transistor Qn11 turns off with the complementary signal VB. As a result, the boosted voltage level Vpp rises from the positive power voltage level Vcc toward the boosted voltage level Vpp.

The row address decoded signal of the ground voltage level passes through the n-channel enhancement type transfer transistor Qn21, and reaches the input node of the inverter INV1. The p-channel enhancement type switching transistor Qp12 turns on, and the variable voltage line VPW supplies the variable voltage Vpw to the selected word line WL1. The selected word line reaches 10 volts at time t11, and the write-in pulse signal is applied to the control gate electrodes of the floating gate type field effect transistors M111–M11n to Mi11–Mi1n.

While the selected word line WL1 is staying at 10 volts, the write-in unit 14 supplies 5 volts through the addressing system 12 to the selected digit line DL11, and the erase/verify unit 16 maintains the source line S1 at the ground voltage level. Hot electrons are generated in the drain region of the floating gate type field effect transistor M111, and are injected into the floating gate electrode. The floating gate type field effect transistor M111 increases the threshold to or over 6 volts, and enters into the write-in state.

Upon completion of the electron injection into the floating gate electrode, the internal control signal VA and the complementary signal VB are changed to the group voltage level and the boosted voltage level, respectively, at time t12. The n-channel enhancement type switching transistor Qn10 turns off, and the other n-channel enhancement type switching transistor Qn11 turns on. As a result, current flows through the n-channel enhancement type switching transistor Qn11 into the positive power voltage line Vcc, and the variable voltage Vpw is decreased toward the positive power voltage Vcc. The variable voltage Vpw reaches the positive power voltage Vcc at time t13.

The NAND gate ND1 starts the row address decoded signal to rise at time t14. The p-channel enhancement type switching transistor Qp12 turns off, and the n-channel enhancement type switching transistor Qn13 turns on. Then, the inverter INV1 starts the selected word line WL1 to decay from the positive power voltage level Vcc to the ground voltage level, and the word line WL1 reaches the ground level at time t15.

Even though the variable voltage Vpw at 10 volts is applied to the other inverter INVm associated with the non-selected word line WLm, the n-channel enhancement type transfer transistor Qn2m turns off, and prevents the NAND gate NDm from the variable voltage Vpw at 10 volts.

Figure 8:
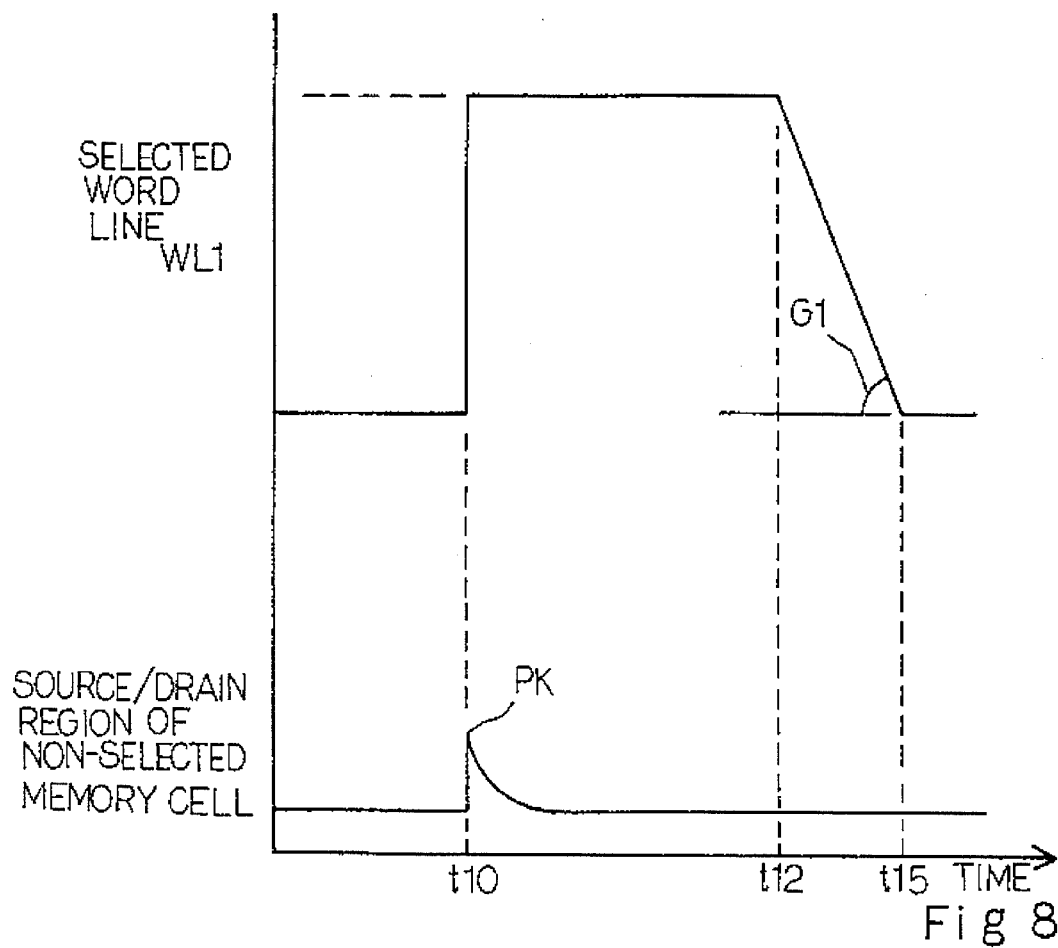
FIG. 8 is a diagram showing the potential level on a selected word line and potential level in source/drain regions of a non-selected memory cell.

The selected word line WL1 macroscopically behaves as shown in FIG. 8. The potential on the word line is assumed to decay from time t12 and time t15 at an average gradient G1. The selected word line WL1 is further coupled to the non-selected memory cell such as Mill, and each of the n-type source and drain regions has a time constant CR under the forward bias condition. The time constant CR is calculated on the basis of the parasitic capacitance coupled to each source/drain region and the resistance against current flowing out from the source/drain region. If potential decays from 10 volts to 5 volts through an equivalent circuit having the time constant CR, the gradient of the potential decay is to be G2. In practice, the time constant CR is determined by measuring time from the positive peak voltage PK to the ground voltage. The time constant CR may be determined by measuring time from the negative peak of the undershoot to the ground voltage.

The present inventor found that the undesirable forward current did not flow from the p-type semiconductor substrate 10 to the source/drain region of the non-selected memory cell in so far as the gradient G1 is smaller than the gradient G2. This means that hot electrons are not produced in the source/drain region of the non-selected memory cell, and, accordingly, the non-selected memory cell is free from the gate disturb. The first gate insulating layer on the channel region is not damaged.

In this instance, the gradient in the time period T1 is smaller than the gradient G2.

Figure 9:
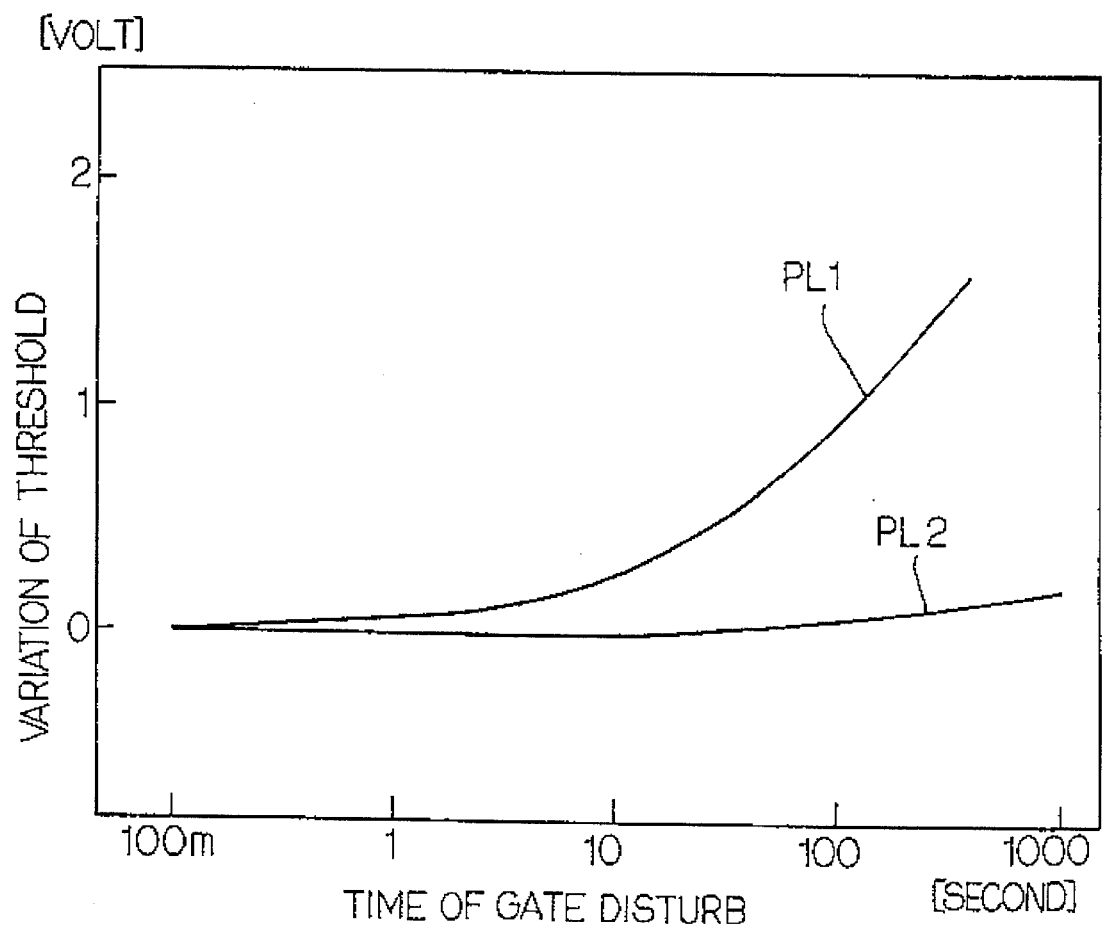
FIG. 9 is a graph showing the threshold of a non-selected memory cell under the gate disturb.

The present inventor measured the threshold of the non-selected memory cell, and plotted variation of the threshold in FIG. 9. Plots PL1 represented the threshold of the non-selected memory cell of the prior art electrically erasable and programmable read only memory device, and plots PL2 were indicative of the threshold of the non-selected memory cell of the electrically erasable and programmable read only memory device according to the present invention. Comparing plots PL1 with plots PL2, it is understood that the write-in pulse slowly decayed is effective against the gate disturb.

The read-out sequence and the erasing sequence are similar to those of the prior art electrically erasable and programmable read only memory device, and are not described for avoiding repetition.

Second Embodiment

Figure 10:
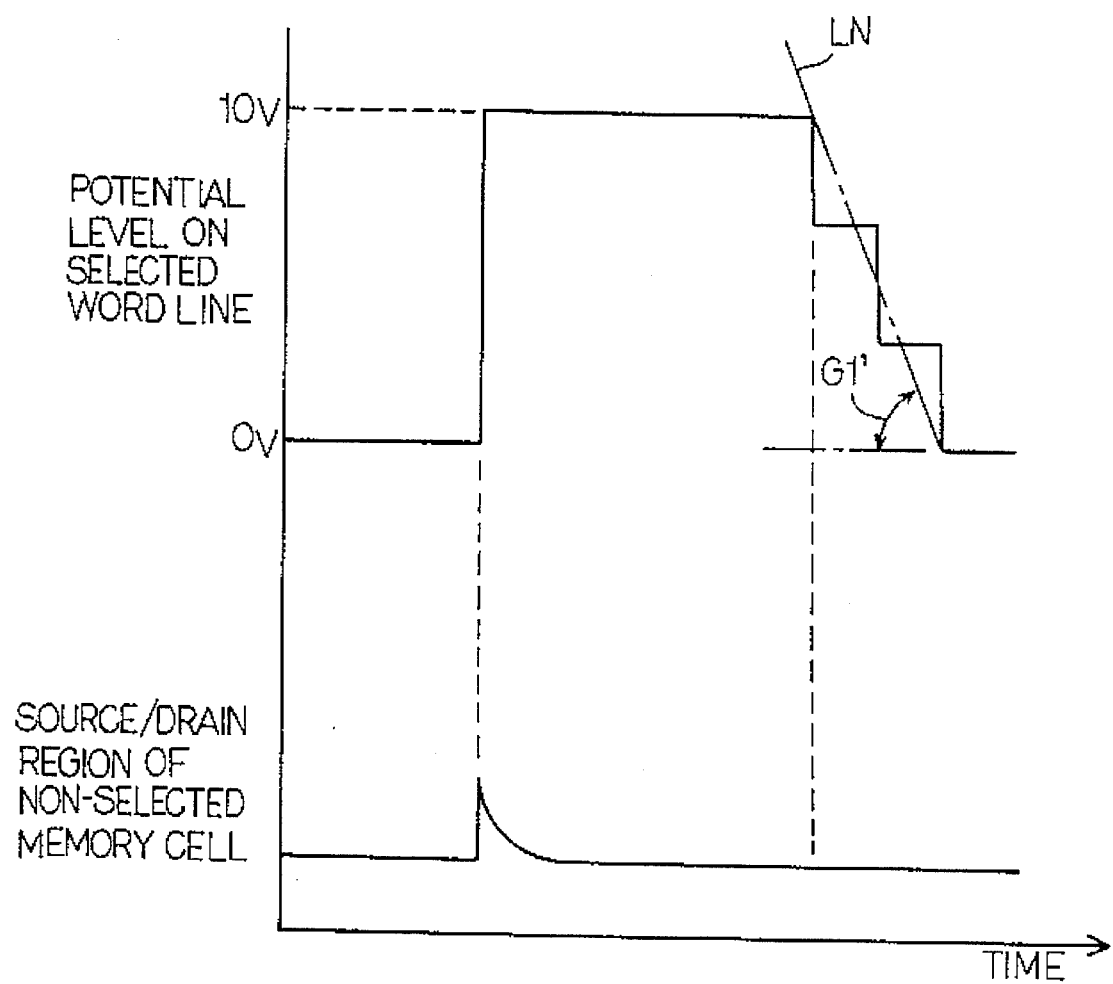
FIG. 10 is a diagram showing the waveform of a write-in pulse signal used in the electrically erasable and programmable read only memory device shown.

FIG. 10 illustrates the waveform of a write-in pulse signal supplied from a row addressing system to a selected word line incorporated in another electrically erasable and programmable read only memory device embodying the present invention. The variable voltage source step-wise changes the variable voltage Vpw from 10 volts to the ground voltage, and, accordingly, the word line driver step-wise decreases the potential level on the selected word line.

Even though the potential level on the selected word line is step-wise decreased, the stepped waveform is approximated to a linear line LN, and the gradient G1' is smaller than the gradient G2 as similar to the first embodiment.

As will be understood from the foregoing description, the write-in pulse signal is slowly decayed, and the undesirable gate disturb does not take place in the non-selected memory cells coupled to the selected word line.

Although particular embodiments of the present invention have been shown and described, it will be obvious to those skilled in the art that various changes and modifications may be made without departing from the spirit and scope of the present invention.

For example, the write-in operation may be concurrently carried out on a plurality of floating gate type field effect transistors.

What is claimed is:

1. A method of writing data into a memory cell, comprising steps of:

a) preparing a semiconductor non-volatile memory device including a plurality of floating gate type field effect transistors serving as addressable memory cells and grouped into a plurality of sectors, each of said plurality of floating gate type field effect transistors having source and drain regions spaced from each other, a floating gate electrode associated with said source and drain regions and electrically isolated from said source and drain regions and a control gate electrode associated with said source and drain regions and electrically isolated from said floating gate electrode and said source and drain regions, a plurality of word lines shared between said plurality of sectors and selectively connected to control gate electrodes of said plurality of floating gate type field effect transistors, and an addressing system having a row addressing subsystem for selectively supplying a write-in pulse signal to said plurality of word lines;

b) increasing said write-in pulse signal on a selected one of said plurality of word lines for writing data into at least one floating gate type field effect transistor of a selected one of said plurality of sectors; and c) decaying said write-in pulse along a waveform having a first gradient smaller than a second gradient of a waveform of a pulse signal applied to one of said source and drain regions forming a part of the floating gate type field effect transistor incorporated in a non-selected one of said sectors and coupled to said selected one of said plurality of word lines.

2. The method as set forth in claim 1, in which said write-in pulse is step-wise decayed, and the stepped waveform is approximated to a linear line having said first gradient.

3. A write-in method for a semiconductor memory device having impurity regions serving as a source region and a drain region and formed in surface portions of a semiconductor substrate, a floating gate electrode provided on a first gate insulating layer covering said semiconductor substrate between said source region and said drain region and a control gate electrode provided on a second gate insulating layer covering said floating gate electrode, said method comprising steps of:

data being written into said semiconductor memory device by applying a signal to said control gate, said signal applied to said control gate electrode and changed from a high potential level to a low potential level being approximated to a linear line, a gradient of said linear line being smaller than a gradient of a transition from said high potential level to said low potential level under a time constant determined by a diffusion capacitance and a resistance of each of said impurity regions.

* * * * *